(12) United States Patent
Ukawa et al.

(10) Patent No.: US 10,756,246 B2
(45) Date of Patent: Aug. 25, 2020

(54) LIGHT EMITTING DEVICE

(71) Applicant: Nichia Corporation, Anan-shi, Tokushima (JP)

(72) Inventors: Hiroaki Ukawa, Itano-gun (JP); Ryuichi Nakagami, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/152,370

(22) Filed: Oct. 4, 2018

(65) Prior Publication Data
US 2019/0115512 A1 Apr. 18, 2019

(30) Foreign Application Priority Data

Oct. 12, 2017 (JP) ................................. 2017-198300

(51) Int. Cl.
*H01L 33/62* (2010.01)
*H01L 33/60* (2010.01)
*H01L 33/48* (2010.01)
*H01L 25/16* (2006.01)
*H01L 33/54* (2010.01)

(52) U.S. Cl.
CPC ............ *H01L 33/62* (2013.01); *H01L 25/167* (2013.01); *H01L 33/486* (2013.01); *H01L 33/60* (2013.01); *H01L 33/54* (2013.01)

(58) Field of Classification Search
None
See application file for complete search history.

(56) References Cited

U.S. PATENT DOCUMENTS

| | | | |
|---|---|---|---|
| 9,613,940 B2* | 4/2017 | Yu | ........................... H01L 23/00 |
| 2007/0194422 A1 | 8/2007 | Lai et al. | |
| 2008/0298063 A1 | 12/2008 | Hayashi | |
| 2010/0059782 A1* | 3/2010 | Fujitomo | .......... H01L 31/02002 257/98 |
| 2010/0084683 A1 | 4/2010 | Lai et al. | |
| 2010/0264449 A1 | 10/2010 | Hayashi | |
| 2011/0111082 A1 | 5/2011 | Hayashi | |
| 2011/0248623 A1* | 10/2011 | Ichikawa | .................. F21K 9/00 313/483 |

(Continued)

FOREIGN PATENT DOCUMENTS

| | | | |
|---|---|---|---|
| JP | 2007-227882 A | 9/2007 | |
| JP | 2008-047712 A | 2/2008 | |

(Continued)

*Primary Examiner* — Benjamin P Sandvik
(74) *Attorney, Agent, or Firm* — Foley & Lardner LLP

(57) ABSTRACT

A light emitting device includes: a base member including: a first lead, a second lead, and a supporting member, the base member having an upper surface including a first surface, which is a surface of the first lead, a second surface, which is a surface of the second lead, and a third surface, which is a surface of the supporting member; a light emitting element located on the first surface; a protective element located on the second surface; a wire having a first end connected to the first surface, and a second end connected to a terminal electrode of the protective element; a resin frame located on the upper surface of the base member; a first resin part surrounded by the resin frame and covering the light emitting element and the first end of the wire; and a second resin part covering the resin frame and the first resin part.

14 Claims, 11 Drawing Sheets

(56) References Cited

U.S. PATENT DOCUMENTS

| | | | |
|---|---|---|---|
| 2012/0037944 A1 | 2/2012 | Takine | |
| 2012/0138997 A1* | 6/2012 | Tasaki | G02B 5/0808 257/98 |
| 2012/0162998 A1* | 6/2012 | Takahashi | H01L 33/486 362/363 |
| 2012/0193791 A1* | 8/2012 | Seno | H01L 24/49 257/738 |
| 2012/0273826 A1* | 11/2012 | Yamamoto | H01L 33/62 257/99 |
| 2014/0131756 A1* | 5/2014 | Koseki | H01L 33/641 257/99 |
| 2014/0291716 A1* | 10/2014 | Ukawa | H01L 33/505 257/98 |
| 2015/0189703 A1 | 7/2015 | Akazawa | |
| 2015/0207049 A1* | 7/2015 | Ko | H01L 25/167 257/98 |
| 2015/0270450 A1 | 9/2015 | Kuroki et al. | |
| 2016/0005942 A1 | 1/2016 | Ukawa | |
| 2016/0284952 A1* | 9/2016 | Takeda | H01L 33/0095 |
| 2017/0194542 A1 | 7/2017 | Ukawa | |

FOREIGN PATENT DOCUMENTS

| | | |
|---|---|---|
| JP | 2008-300694 A | 12/2008 |
| JP | 2009-135496 A | 6/2009 |
| JP | 2009-200321 A | 9/2009 |
| JP | 2013-206895 A | 10/2013 |
| JP | 2014-209602 A | 11/2014 |
| JP | 2015-128092 A | 7/2015 |
| JP | 2015-179777 A | 10/2015 |
| WO | WO-2010/150754 A1 | 12/2010 |

* cited by examiner

LIGHT EMITTING DEVICE

CROSS-REFERENCE TO RELATED APPLICATION

This application claims priority to Japanese Patent Application No. 2017-198300, filed on Oct. 12, 2017, the disclosure of which is hereby incorporated by reference in its entirety.

BACKGROUND

The present disclosure relates to a light emitting device.

A light emitting device including a light emitting element such as a light emitting diode is widely used in various applications, due to its high light emission efficiency, small size, and long operation life. For example, Japanese Patent Publication No. 2013-206895 A discloses a light emitting device including a light emitting element and a pedestal part (i.e., a base member) in which a first lead frame and a second lead frame are integrally molded with resin. The light emitting device is manufactured by: mounting the light emitting element on the first lead frame; connecting the light emitting element and the second lead frame to each other; and thereafter encapsulating the light emitting element on the pedestal part. In the light emitting device disclosed in Japanese Patent Publication No. 2013-206895, in encapsulating the light emitting element, a resin frame is provided on the pedestal part (i.e., the base member) to stop the flow of the encapsulating resin for encapsulating the light emitting element. Japanese Patent Publication No. 2013-206895 teaches that this structure provides an optical semiconductor device that can exhibit high heat dissipation property and high durability at lower costs. Further, while not explicitly described in Japanese Patent Publication No. 2013-206895, what is often employed is a structure in which a protective element such as a Zener diode is mounted together with the light emitting element on the pedestal part (the base member), in order to protect the light emitting element.

SUMMARY

Recent years have seen an increasing demand for a light emitting device that exhibits high light emission efficiency.

Accordingly, an object of the present disclosure is to provide a light emitting device that exhibits high light emission efficiency.

A light emitting device according to one embodiment of the present disclosure includes: a base member including a first lead, a second lead, and a supporting member, a light emitting element, a protective element, a wire, a resin frame, a first resin part, a second resin part. The supporting member holds the first lead and the second lead while electrically separating the first lead and the second lead from each other. The base member has an upper surface including a first surface, which is a surface of the first lead, a second surface, which is a surface of the second lead, and a third surface, which is a surface of the supporting member. The light emitting element is located on the first surface. The protective element is located on the second surface and includes a terminal electrode. The wire has a first end connected to the first surface, and a second end connected to the terminal electrode of the protective element. The resin frame is located on the upper surface of the base member in such a manner as to cover at least part of the protective element and surround the light emitting element and the first end of the wire. The first resin part is surrounded by the resin frame and covers the light emitting element and the first end of the wire. The second resin part covers the resin frame and the first resin part. The resin frame includes a resin portion and a light-reflective member. The first resin part has a refractive index greater than a refractive index of the second resin part, and greater than a refractive index of the resin portion of the resin frame. The light-reflective member of the resin frame has a refractive index greater than a refractive index of the resin portion of the resin frame.

The light emitting device according to certain embodiments of the present disclosure provides a light emitting device that exhibits high light emission efficiency.

DETAILED DESCRIPTION

Figure 1A:
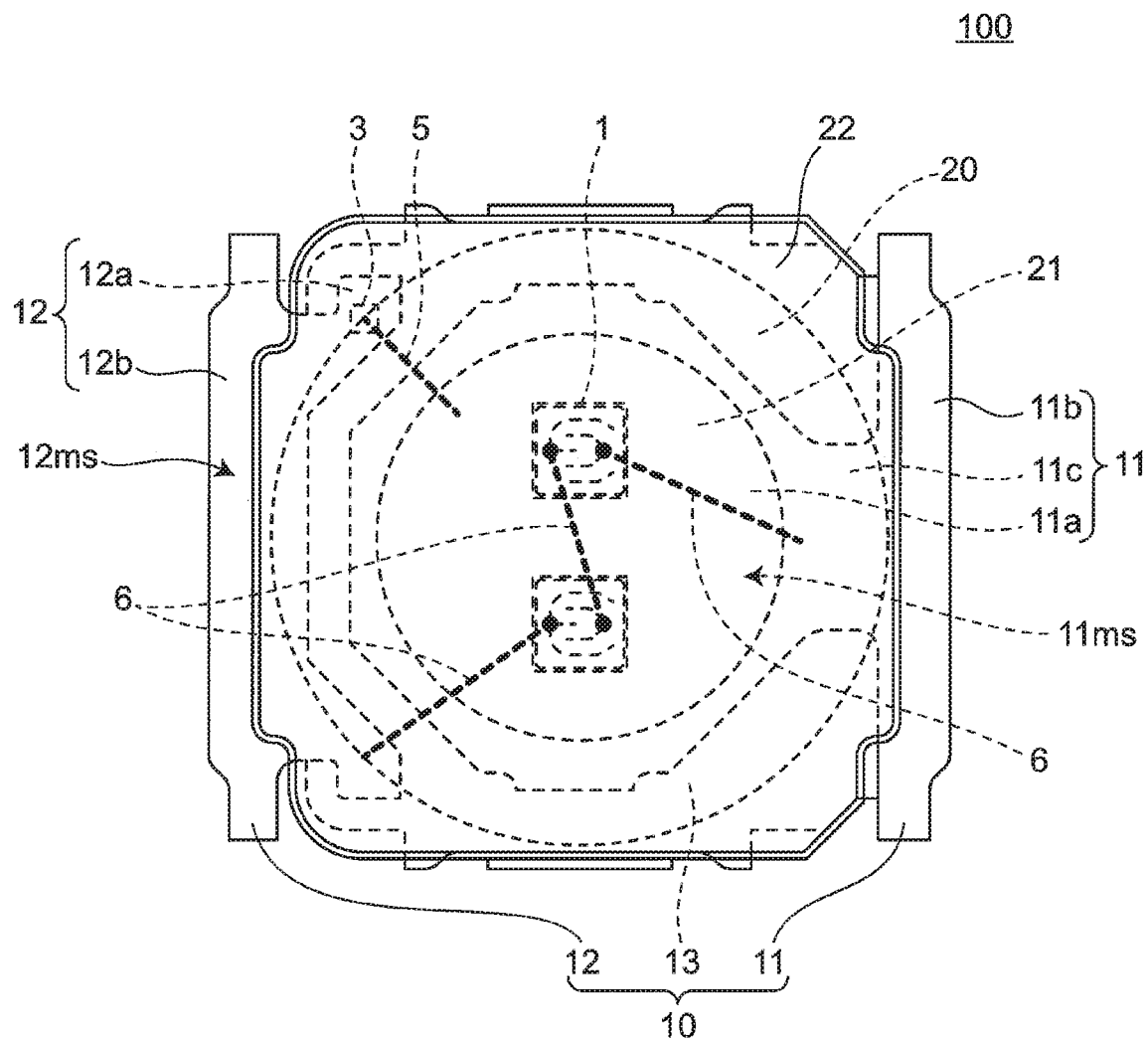
FIG. 1A is a plan view showing the structure of a light emitting device according to an embodiment of the present disclosure.

A description of embodiments of the invention will be provided below with reference to the drawings as appropriate. While embodiments of a light emitting device and a method of manufacturing a light emitting device are described below to explain the technical ideas of the present disclosure, the invention is not limited to the described embodiments. Further, the descriptions of one embodiment are also applicable to other embodiments. Identical names and reference characters used in describing the structure of the embodiments denote identical or similar members, and the repeated detailed description thereof will be omitted as appropriate. Further, the size, the number of repetitions, the positional relationship and the like of the members shown in the drawing may be exaggerated or omitted for the sake of clarity.

Figure 1B:
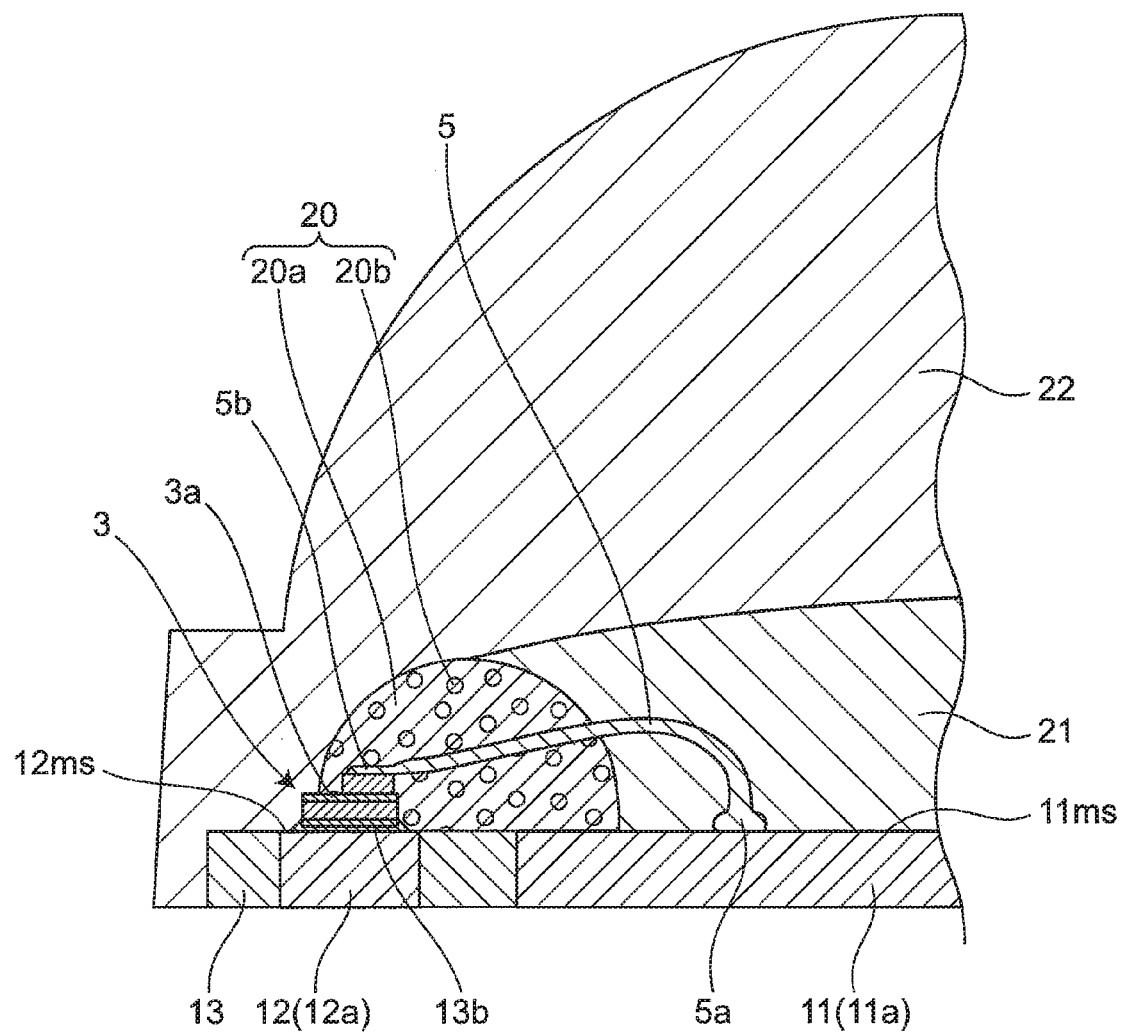
FIG. 1B is an enlarged partial cross-sectional view showing part of the cross section of the light emitting device according to the embodiment.

FIG. 1A is a plan view showing the structure of a light emitting device according to one embodiment of the present disclosure. Further, FIG. 1B is an enlarged partial cross-sectional view showing part of the cross-section of the light emitting device according to the embodiment.

The light emitting device according to the present embodiment includes a base member 10, and light emitting elements 1 and a protective element 3 both provided on the base member 10. The base member 10 includes a first lead frame (hereinafter simply referred to as the first lead) 11, a second lead frame (hereinafter simply referred to as the second lead) 12, a supporting member 13 holding the first lead 11 and the second lead 12 while electrically separating the first lead 11 and the second lead 12 from each other. The light emitting device according to the present embodiment includes two light emitting elements 1. The two light emitting elements 1 are provided on a first surface 11ms (i.e., the upper surface) of the first lead 11. The number of the light emitting elements may be one, or two or more. The light emitting elements are mounted on the first lead 11 comprising metal, and thus heat of the light emitting elements is transferred to the first lead comprising metal. Thus, the heat dissipation property of the light emitting device improves. Further, the lower surface of the first lead 11 is preferably exposed outside the supporting member 13. With this structure, when the light emitting device 100 is mounted on a mounting substrate, the contact area between the mounting substrate and the first lead 11 increases. Thus, the heat dissipation property of the light emitting device improves. Further, the protective element 3 is provided on a second surface 12ms (i.e., the upper surface) of the second lead 12. Here, in the base member 10, the first surface 11ms of the first lead 11, the second surface 12ms of the second lead 12, and a third surface 13a (i.e., the upper surface) of the supporting member are preferably positioned on a substantially identical plane. This structure can reduce the thickness of the base member 10 and, consequently, the light emitting device can be reduced in thickness. In the present specification, a "substantially identical plane" refers to a tolerance of about ±50 μm.

In the light emitting device according to the present embodiment, each of the two light emitting elements 1 includes a lower surface, and an upper surface where an n-electrode and a p-electrode are formed. The lower surface of each light emitting element 1 is bonded to the first surface 11ms of the first lead 11, and thereby fixed to the first lead 11. Further, the n-electrode formed at the upper surface of one of the light emitting elements 1 is electrically connected to the first lead 11 with a wire 6. The p-electrode formed at the upper surface of the one light emitting element 1 is electrically connected to the n-electrode of the other light emitting element 1 with a wire 6. Further, the p-electrode of the other light emitting element 1 is electrically connected to the second lead 12 with a wire 6. Thus, the two light emitting elements 1 are connected in series between the first lead 11 and the second lead 12 of the base member 10.

In the light emitting device according to the present embodiment, the protective element 3 is, for example, a Zener diode, and includes a cathode-side terminal electrode 3a at its upper surface and an anode-side terminal electrode 3b at its lower surface. The protective element 3 has its terminal electrode 3b at its lower surface fixed onto the second surface 12ms of the second lead 12 with, for example, a conductive adhesive member 8, thereby electrically connected to the second lead 12. Further, the cathode-side terminal electrode 3a of the protective element 3 is electrically connected to the first lead 11 with a wire 5. The wire 5 includes a first end and a second end. The first end is a portion of the wire where the wire is connected to the first surface. The second end is a portion of the wire connected to the terminal electrode of the protective element. The protective element 3 is connected between the first lead 11 and the second lead 12 of the base member 10, in parallel to the two light emitting elements 1 that are connected in series.

Further, the light emitting device according to the present embodiment includes a resin frame 20 that is provided at the upper surface of the base member 10 and covers at least part of the protective element 3. The resin frame 20 is provided so as to surround the two light emitting elements 1 and a first end 5a which is an end of the wire 5 on the first lead 11 side, the wire 5 connecting between the cathode-side terminal electrode 3a of the protective element 3 and the first lead 11. The light emitting device according to the present embodiment further includes a first resin part 21 and a second resin part 22. The first resin part 21 is surrounded by the resin frame 20, and covers the two light emitting elements 1 and the first end 5a of the wire 5. The second resin part 22 covers the resin frame 20 and the first resin part 21. The first resin part 21 and the second resin part 22 each comprise light-transmissive resin. Further, the second resin part 22 is formed to be, for example, lens-shaped, and controls the light distribution characteristic of the light emitting device.

In the light emitting device according to the present embodiment structured as described above, the resin frame 20 includes a resin portion 20a and a light-reflective member 20b, and is structured so that the resin portion 20a has a smaller refractive index than the first resin part 21. Thus, light emitted from the lateral surfaces of the light emitting element 1 is reflected at the interface between the first resin part 21 and the resin portion 20a, and exits via the second resin part 22. Further, among the light emitted from the lateral surface of the light emitting element 1, light that fails to be reflected at the interface between the first resin part 21 and the resin portion 20a and enters the resin portion 20a is reflected at the light-reflective member 20b, and exits the light emitting device via the second resin part 22. In the present specification, the refractive index refers to the refractive index with respect to the peak wavelength of the light emitting element. When the light emitting device includes a plurality of light emitting elements, the refractive index means the refractive index with respect to the peak wavelength of the light emitting element having the shortest wavelength.

Here, specifically, the light emitting device according to the present embodiment is configured such that (a) the refractive index of the first resin part 21 is greater than the refractive indices of the second resin part 22 and the resin portion 20a of the resin frame 20, and (b) in the resin frame 20, the refractive index of the light-reflective member 20b is greater than the refractive index of the resin portion 20a.

The light emitting device according to the present embodiment structured as described above realizes efficient extraction of light emitted from the light emitting element, that is, improves the light emission efficiency.

Specifically, (a) setting the refractive index the first resin part 21 to be greater than the refractive index of the second resin part 22 can gradually reduce the refractive index of the members through which the light emitted from the light emitting element passes when the light emitted from the light emitting element exits to the outside via the second resin part 22 from the first resin part 21. This structure can reduce the ratio of the light from the light emitting element that is reflected at the interface of each member through which the light passes. Consequently, the light extraction efficiency of the light emitting device improves.

Further, by virtue of the first resin part 21 having a greater refractive index than the refractive indices of the second resin part 22 and the resin portion 20a, the difference in refractive index between the light emitting element 1 and the first resin part 21 is reduced. This difference reduction can reduce the ratio of the light from the light emitting element that is reflected at the interface between the light emitting element 1 and the first resin part 21 (i.e., the light emitting surface and the lateral surface). Thus, the light from the light emitting element is efficiently emitted from the light emitting element to the first resin part 21. Although the refractive index of the light emitting element varies depending on the thickness and type of the employed semiconductor material and the substrate, the refractive index of the light emitting element is close to the refractive index of a material having the dominant volume in the light emitting element. Therefore, in the present specification, it is defined that the refractive index of the light emitting element is the refractive index of the material having the dominant volume in the light emitting element. Accordingly, in the case where the light emitting element includes a sapphire substrate, normally, the volume of the sapphire substrate is dominant in the light emitting element and, consequently, the refractive index of the sapphire substrate is regarded as the refractive index of the light emitting element. For example, the refractive index of a sapphire substrate is about 1.7. Further, when the light emitting element does not include a sapphire substrate and structured by a semiconductor layer alone, the refractive index of the semiconductor layer is regarded as the refractive index of the light emitting element. For example, the refractive index of a nitride semiconductor is about 2.5. The refractive index of the light emitting element is generally greater than the refractive index of a resin material. Therefore, by virtue of the first resin part 21 having a greater refractive index than refractive indices of the second resin part 22 and the resin portion 20a, the difference in refractive index between the light emitting element 1 and the first resin part 21 is reduced. Further, by virtue of the first resin part 21 having a greater refractive index than the refractive indices of the refractive index of the resin portion 20a, there arises the difference in refractive index between the first resin part 21 and the resin portion 20a. Thus, light from the light emitting element 1 is reflected at the interface between the first resin part 21 and the resin portion 20a, to thereby be efficiently extracted via the second resin part 22.

Further, in the resin frame 20, by virtue of the light-reflective member 20b having a greater refractive index than the refractive index of the resin portion 20a, light entering the resin frame 20 is reflected at the light-reflective member 20b utilizing the difference in refractive index between the light-reflective member 20b and the resin portion 20a, and exits via the second resin part 22. Further, the light-reflective member 20b of the resin frame 20 preferably has a greater refractive index than the refractive index of the first resin part 21. Thus, a greater difference in refractive index between the light-reflective member 20b and the resin portion 20a can be attained. Further, the difference in refractive index between the light-reflective member 20b of the resin frame 20 and the resin portion 20a is preferably 1 or greater.

Further, as will be described later, the light-reflective member 20b is often selectively made of an inorganic substance, such as titanium oxide, that is greater in refractive index than resin. Accordingly, with the resin portion 20a having a smaller refractive index than the reflective index of the first resin part 21, selecting an inorganic substance such as titanium oxide for the light-reflective member 20b can increase the difference in refractive index between the resin portion 20a and the light-reflective member 20b, and can increase the rate of light reflected at the interface between the resin portion 20a and the light-reflective member 20b. Thus, light entering the resin frame 20 is reflected utilizing a relatively great difference in refractive index between the light-reflective member 20b and the resin portion 20a, and efficiently exits via the second resin part 22. For example, the refractive index of titanium oxide is about 2.7.

The resin frame 20 is provided on the base member 10 so as to cover at least part of the protective element 3. This structure minimizes any restriction on the region for mounting the light emitting element, which may otherwise be needed to provide the region for mounting the protective element. Further, the first end 5a of the wire 5 connecting between the terminal electrode 3a of the protective element 3 and the first lead 11 is surrounded by the resin frame 20. Further, the first end 5a is covered with the first resin part 21. Thus, the reliability on the connection between the first lead 11 and the first end 5a increases. This structure can alleviate the risk of breakage of the wire 5 even in the situation where an external force is applied on the wire 5 in chucking during manufacture. Hence, the probability of a reduction in the yield of the light emitting device can be reduced.

Accordingly, the present embodiment can provide a light emitting device having a structure in which the protective element 3 is mounted together with the light emitting elements 1 on the upper surface of the base member 10, so that the light emitting device can be reduced in size and the probability of a reduced yield in manufacture can be alleviated.

In the light emitting device according to the present embodiment, taking into consideration of the above-described relationship of refractive index, for example, phenyl silicone resin may be employed as resin forming the first resin part 21, and dimethyl silicone resin may be employed as resin forming the second resin part 22 and the resin portion 20a of the resin frame 20. The refractive index of the phenyl silicone resin is about 1.54, and the refractive index of dimethyl silicone resin is about 1.41.

Further, in the light emitting device according to the present embodiment, when the first resin part 21 is formed using resin having a hardness greater than the hardness of the second resin part 22, the first resin part 21 is less likely to be deformed by an external force. Consequently, the wire 5 covered with the first resin part 21 is less likely to be deformed and, hence, the reliability on connection improves. For example, the first resin part 21 is formed using phenyl silicone resin of which durometer hardness is in a range of D28 to D53 of the Japanese Industrial Standard K7215, and the second resin part 22 is formed using dimethyl silicone resin of which durometer hardness is in a range of A20 to A70 of the Japanese Industrial Standard K7215.

The first end 5a of the wire 5 preferably has a ball shape having a diameter that is greater than the diameter of the wire 5. A conventionally widely practiced wire bonding technique is the ball/wedge bonding using a gold wire, for example, in which the first bonding is carried out by the ball bonding and the second bonding is carried out by the wedge bonding. In the ball/wedge bonding, it is found that the bonding strength of the ball-bonded portion is weaker than the bonding strength of the wedge-bonded portion. Accordingly, in connecting the terminal electrode 3a of the protective element 3 and the first lead 11 to each other with the wire 5, the connection between the first lead 11 and the wire 5 is carried out by the ball bonding (i.e., the first bonding). Because the ball-bonded portion has the double structure of the first resin part 21 and the resin frame 20, force from the lateral direction of the light emitting device can be alleviated. Therefore, the ball-bonded portion is less likely to be removed from the first lead.

As shown in FIG. 1B, the second end 5b of the wire 5 has a shape thinner than the diameter of the wire, and preferably is connected via a bump 4 provided on the terminal electrode 3a. The connecting part between the terminal electrode 3a formed at the upper surface of the protective element 3 and the wire 5 is covered with the resin frame 20, and positioned relatively closer to the outer periphery of the light emitting device. Accordingly, external force in the lateral direction of the light emitting device tends to be applied to the second end 5b. Therefore, preferably, the connection between the terminal electrode 3a formed at the upper surface of the protective element 3 and the wire 5 is established by the wedge bonding which provides greater bonding strength than the ball bonding does, with the second end 5b of the wire 5 being thinner than the diameter of the wire. This structure can improve the bonding strength between the wire 5 and the terminal electrode 3a of the protective element, and alleviate the risk of breakage of the wire 5. Here, in the wedge bonding a greater load is exerted on the protective element 3 as compared to the ball bonding. Accordingly, in the present embodiment, preferably the bump 4 is formed on the terminal electrode 3a of the protective element 3, and the wire is connected onto the bump 4 by the wedge bonding.

The second end 5b connected onto the terminal electrode 3a of the protective element 3 by the wedge bonding is embedded in the resin frame 20 in order to protect the bonded portion.

The upper surface of the base member 10 positioned inward of the resin frame 20 is preferably formed by only the upper surface of the first lead 11. In this structure, for example, the supporting member 13 comprising resin and exhibiting high light absorbance is not exposed inward of the resin frame 20, whereby the light extraction efficiency improves.

Part of the protective element 3 may be exposed outside the resin frame 20. Part of the protective element 3 exposed outside the resin frame 20 is preferably covered with the second resin part 22. For example, the outer shape of the light emitting device may be quadrangular, the protective element 3 may be disposed at one of the corners of the quadrangle, part of the protective element 3 may be exposed outside the resin frame 20, and the exposed portion may be covered with the second resin part 22. This can reduce the size of the outer shape of the resin frame 20 while protecting the protective element 3. Thus, a reduction in the size of the light emitting device may be achieved.

In the following, a description will be given of a method of manufacturing the light emitting device according to the present embodiment.

The method of manufacturing the light emitting device according to the present embodiment includes providing a base member, mounting a light emitting element, mounting a protective element, forming a wire, forming a resin frame, forming a first resin part, and forming a second resin part.

In the following, a description will be given of each step the method of manufacturing the light emitting device according to an embodiment.

1. Providing Base Member

Here, a plurality of base members 10 each including the first lead 11, the second lead 12, and the supporting member 13 holding the first lead 11 and the second lead 12 is manufactured in one lead frame. Hereinafter, in the manufacturing method according to the present embodiment, a portion corresponding to one individual base member 10 is referred to as a unit region 210.

1-1. Providing Lead Frame

Figure 2:
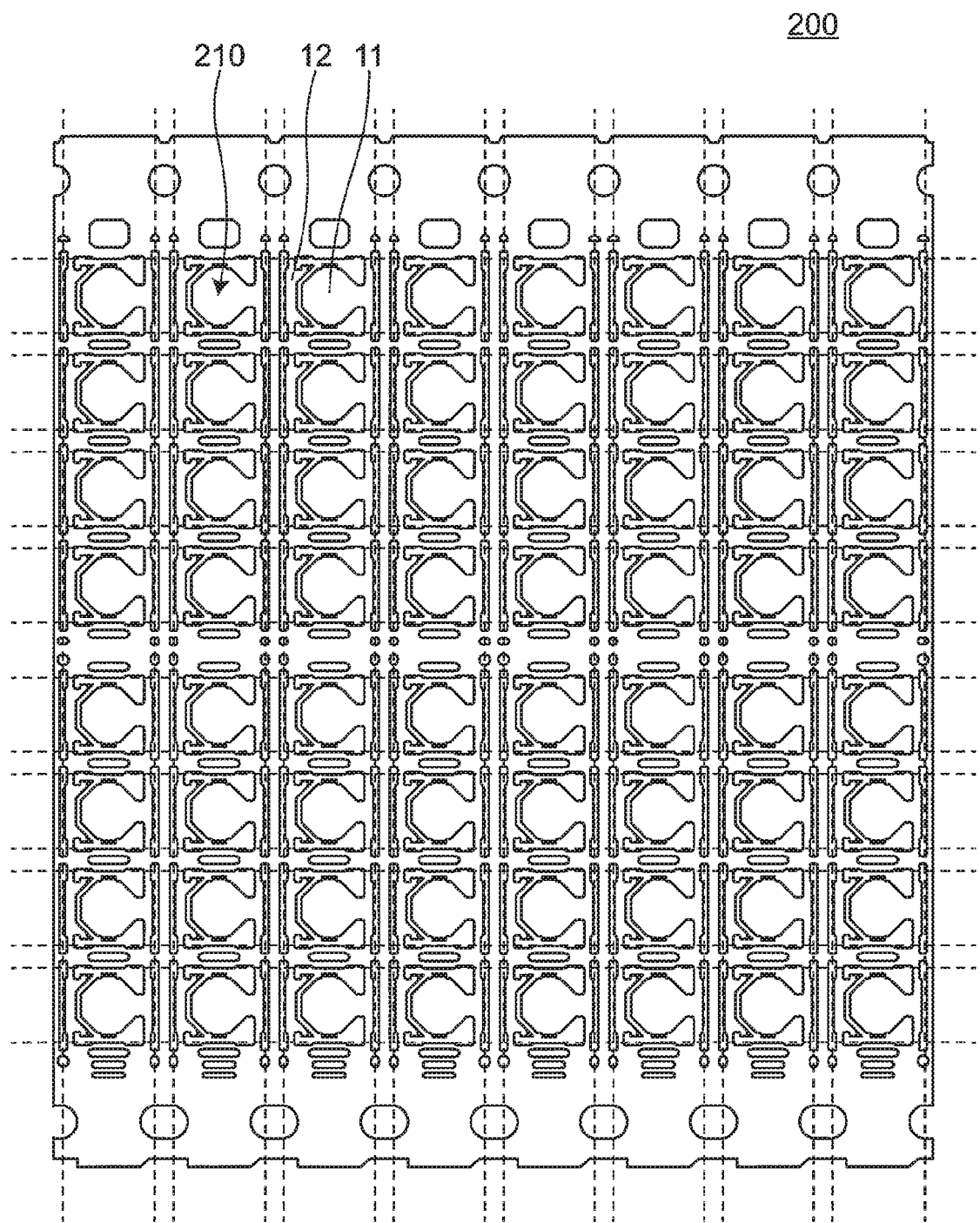
FIG. 2 is a plan view of a lead frame used in producing a base member in a method of manufacturing the light emitting device according to the embodiment.

As shown in FIG. 2, a lead frame 200 in which the unit regions 210 each including the first lead and the second lead are arranged in, for example, a matrix of 8 rows and 8 columns, is provided.

With reference to FIGS. 2 and 3A to 3D, a detailed description will be given of the lead frame 200. FIGS. 3A to 3D, 4A to 4D, 5A, 6A, 7A, and 8A referred to in the following description show only the unit region 210 in an enlarged manner.

The lead frame 200 is manufactured by subjecting a metal plate composed of, for example, aluminum, iron, nickel, copper, copper alloy, stainless steel, or iron alloy such as invar alloy to a process such as etching, punching, or grinding, so that the metal plate has a predetermined shape. The thickness of the lead frame is in a range of, for example, about 200 μm to 300 μm inclusive, and preferably is in a range of 230 μm to 280 μm inclusive.

Figure 3A:
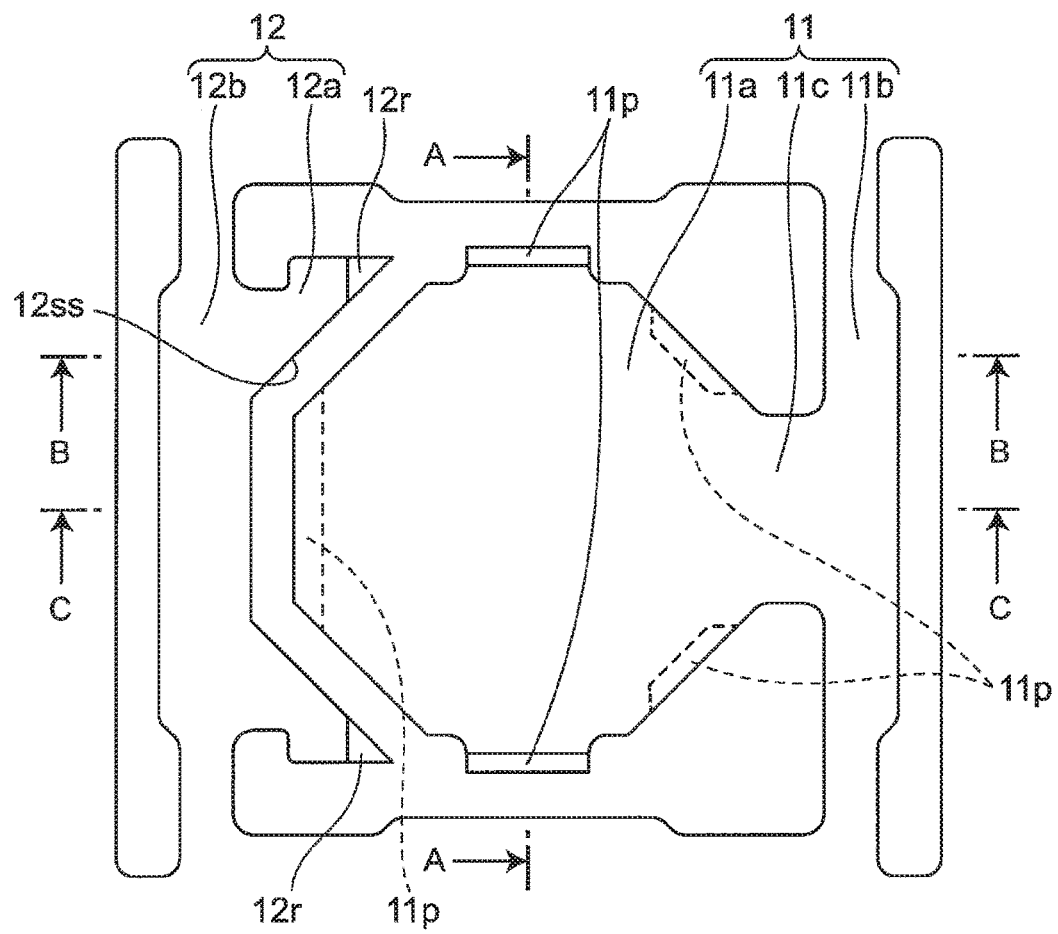
FIG. 3A is an enlarged plan view showing one unit region of the lead frame shown in FIG. 2.
Figure 3B:
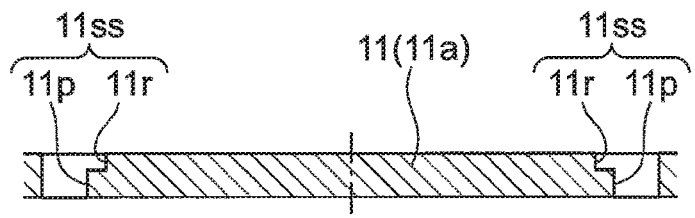
FIG. 3B is a cross-sectional view taken along line A-A in FIG. 3A.
Figure 3C:
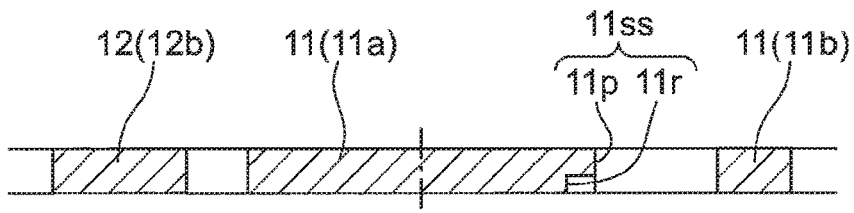
FIG. 3C is a cross-sectional view taken along line B-B in FIG. 3A.
Figure 3D:
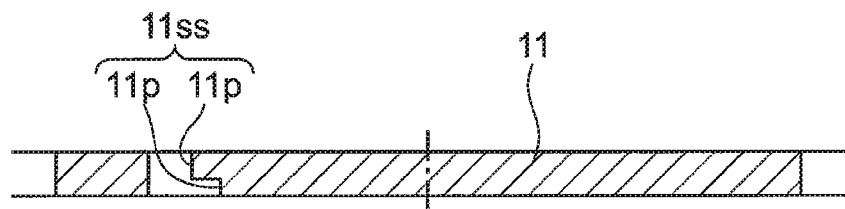
FIG. 3D is a cross-sectional view taken along line C-C in FIG. 3A.

As shown in FIG. 3A, the first lead 11 includes a main part 11a having, for example, a substantially octagonal planar shape, a terminal part 11b extending along one side of the unit region 210, and a linking part 11c connecting between the main part 11a and the terminal part 11b. As shown in FIG. 3A, the second lead 12 includes a terminal part 12b extending along a side opposite to the aforementioned one side of the unit region 210, and substantially triangular extending parts 12a respectively extending from the both ends of the terminal part 12b along the main part 11a of the first lead 11. The second lead 12 structured as described above is disposed so as to be spaced apart by a substantially constant distance from the three sides of the octagonal shape of the main part 11a in the first lead 11.

Further, the lead frame 200 is supported by the supporting member 13. For example, preferably a projecting part (i.e., a step) is formed at the lateral surface of the first lead and/or the lateral surface of the second lead. This structure increases the contact area between the lead frame 200 and the supporting member 13 formed using, for example, resin. Additionally, this structure improves adhesion between the lead frame 200 and the supporting member 13 by virtue of the projecting part engaging with the supporting member 13. For example, as shown in FIGS. 3A to 3D, the first lead 11 includes five projecting parts 11p at a lateral surface 11ss. As shown in FIG. 3A, the second lead 12 includes two projecting parts at a lateral surface 12ss. Here, in the first lead 11, the five projecting parts 11p are provided respectively at the five sides of the main part 11a, and the two projecting parts are respectively provided at the tip portions of the extending parts 12a in the second lead 12. In FIGS. 3A to 3D, those depressed portions (i.e., the recessed parts) generated by provision of the projecting parts 11p are denoted by the reference character 11r. Further, in FIG. 3A, those recessed parts recessed from the surface by provision of two projecting parts are denoted by the reference character 12r. Further, the surface of the lead frame 200 may be plated with gold, silver, nickel, palladium or alloy of the foregoing metals.

1-2. Forming Supporting Member

In the supporting member forming step, for example, by forming resin between the first lead 11 and the second lead 12 by resin molding, the supporting member 13 that supports the first lead 11 and the second lead 12 is formed.

Figure 4A:
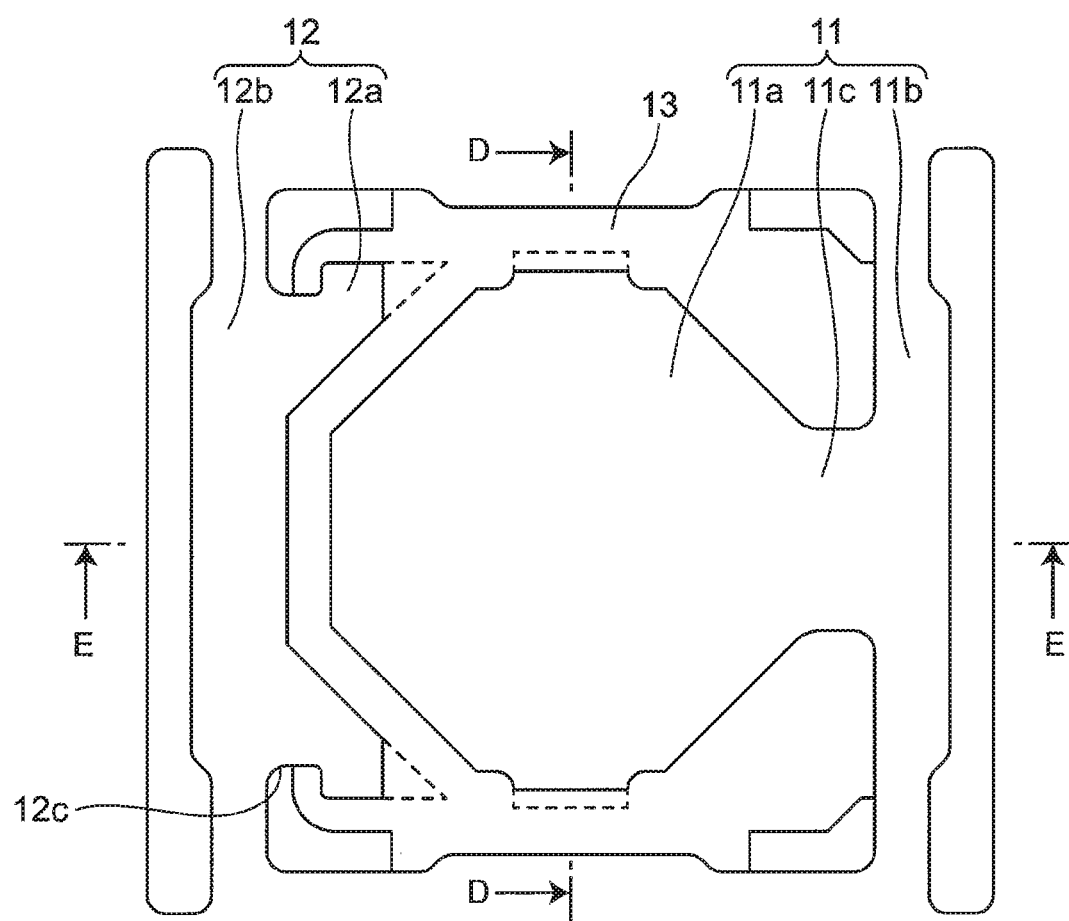
FIG. 4A is a plan view of a unit region after a supporting member is formed at the lead frame shown in FIG. 2.
Figure 4B:
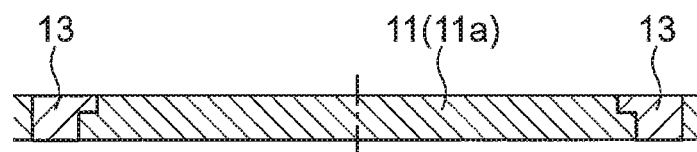
FIG. 4B is a cross-sectional view taken along line D-D in FIG. 4A.
Figure 4C:
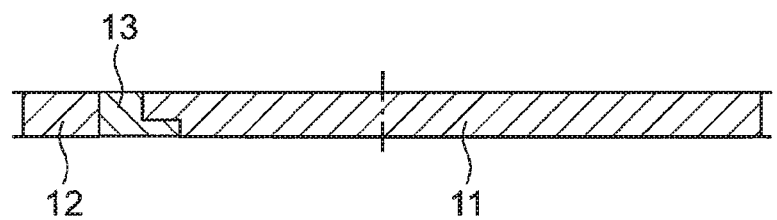
FIG. 4C is a cross-sectional view taken along line E-E in FIG. 4A.

As shown in FIG. 4A, the supporting member 13 surrounds the main part 11a of the first lead 11 in addition to extending between the first lead 11 and the second lead 12. The supporting member 13 further extends to the lateral surface of the outer periphery of the two extending parts 12a of the second lead 12, so as to support the extending parts 12a from the outer side and the inner side. Further, as shown in FIG. 4A, at each of the extending parts 12a, a cut-out part 12c being inwardly recessed as seen in a plan view is preferably formed at the portion linked to the terminal part 12b. Thus, the supporting member 13 can more strongly support the extending parts 12a. The recessed part 12r at positioned at the tip portion of each of the extending parts 12a is covered with the supporting member 13, whereby the extending parts 12a of the second lead 12 are more strongly supported.

The molding resin material forming the supporting member 13 may be, for example, thermosetting resin such as epoxy resin or silicone resin, or thermoplastic resin such as liquid crystal polymer, polyphthalamide resin, or polybutylene terephthalate (PBT). Further, mixing white pigment such as titanium oxide with the molding material to form the supporting member 13, the light reflectivity of the supporting member 13 can be improved.

Figure 4D:
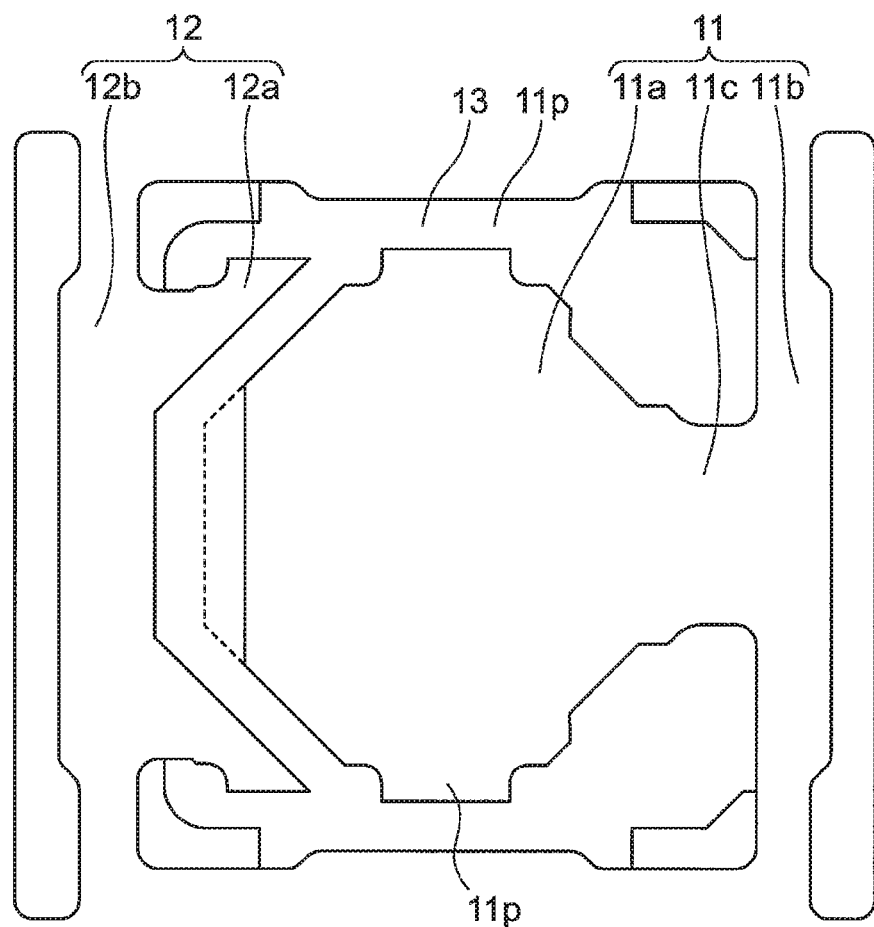
FIG. 4D is a plan view of the back surface of the unit region shown in FIG. 4A.

In the foregoing manner, a plurality of base members 10 each including the unit region 210 where the first lead 11 and the second lead 12 are supported by the supporting member 13 while being electrically separated from each other is formed in one lead frame. FIG. 4D is a bottom view of the base member 10 after the supporting member 13 is formed.

2. Mounting Light Emitting Element

Figure 5A:
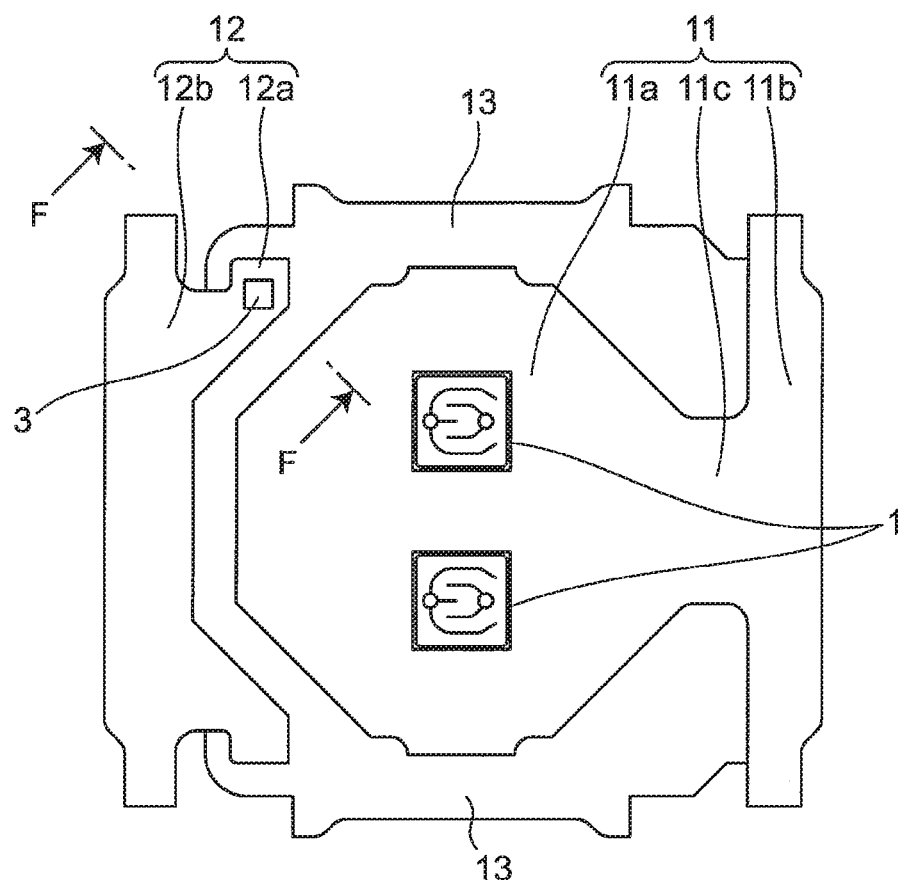
FIG. 5A is a plan view of the unit region after the light emitting element and a protection element are mounted on the lead frame.
Figure 5B:
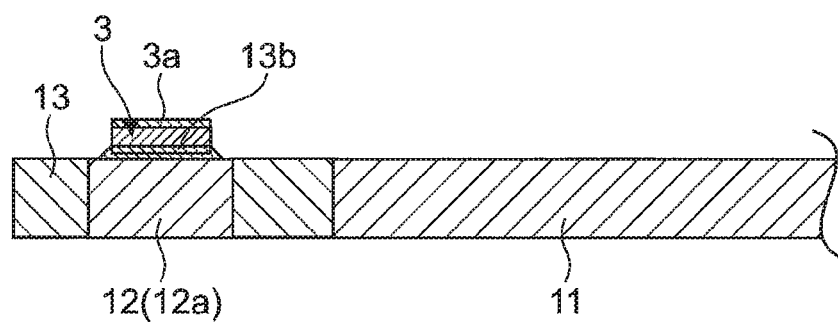
FIG. 5B is a cross-sectional view taken along line F-F in FIG. 5A.

As shown in FIG. 5A, the light emitting elements 1 are mounted and fixed at predetermined positions on the main part 11a of the first lead 11. The light emitting elements 1 are fixed on the main part 11a with, for example, silicone resin. The light emitting elements may be known semiconductor light emitting elements comprising nitride semiconductor and the like. The light emission wavelength of the light emitting element may be selected from the ultraviolet spectrum to the infrared spectrum including the visible spectrum (i.e., 380 nm to 780 nm). For example, a nitride semiconductor may be employed as a light emitting element having a peak wavelength is in a range of 430 nm to 490 nm. Specifically, a nitride semiconductor $(In_XAl_YGa_{1-X-Y}N,$ where $0 \leq X$, $0 \leq Y$, $X+Y \leq 1$) may be used.

3. Mounting Protective Element

As shown in FIG. 5A, the protective element 3 is mounted and fixed at a predetermined position on the extending part 12a of the second lead 12. The protective element 3 includes a cathode-side terminal electrode 3a at its upper surface, and includes an anode-side terminal electrode 3b at its lower surface, for example. In order for the anode-side terminal electrode 3b to establish electrical connection with the extending part 12a, the anode-side terminal electrode 3b is fixed onto the extending part 12a via the conductive adhesive member 8 such as epoxy resin containing Ag.

4. Forming Wire

In the step of forming a wire, a predetermined wiring is provided between the first lead 11 and the second lead 12 by wire bonding. In the following, a description will be given of an exemplary light emitting device including two light emitting elements.

4-1. Wiring Light Emitting Element

Figure 6A:
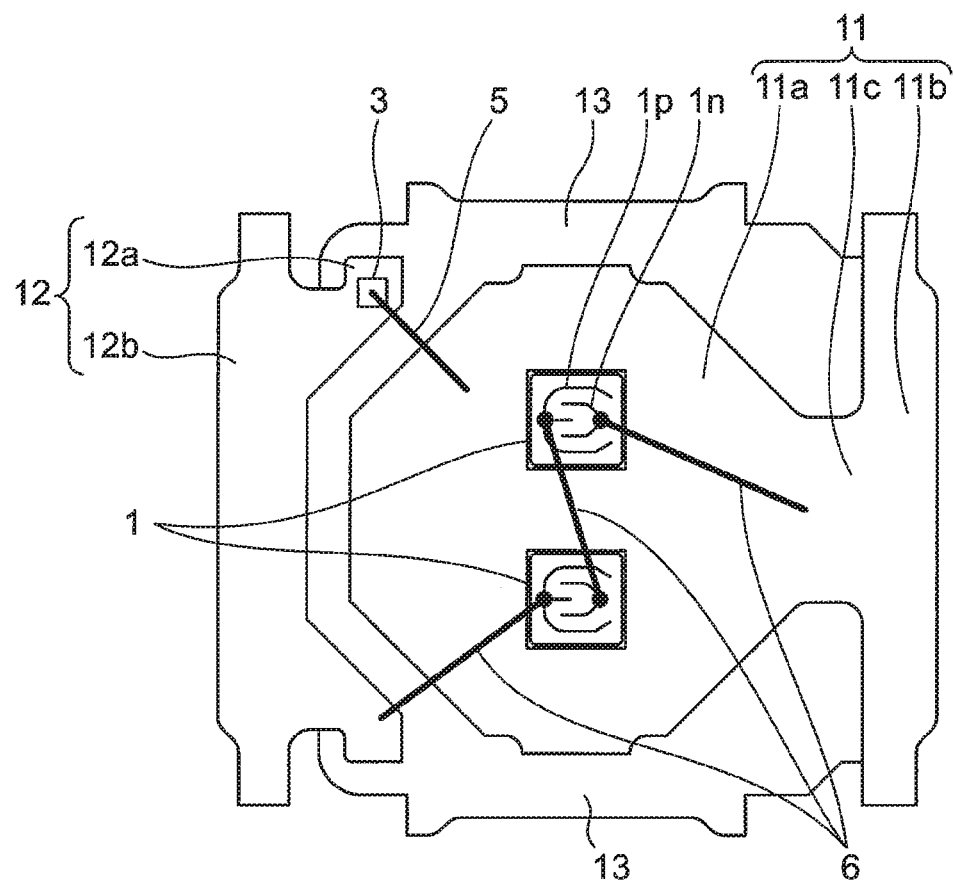
FIG. 6A is a plan view after wiring the mounted light emitting elements and protective element.
Figure 6B:
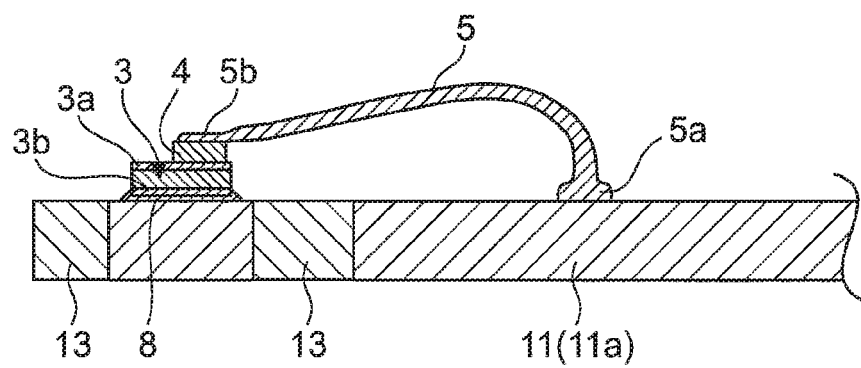
FIG. 6B is a cross-sectional view showing the same portion as FIG. 5B after wiring the protective element.

As shown in FIG. 6A, the light emitting element wiring step includes: a first bonding, a second bonding, and a third bonding. The first bonding comprises connecting an n-electrode In of one of two light emitting elements 1 and the first lead 11 with a wire 6. For example, the first bonding is performed around the boundary between the main part 11a and the linking part 11c. The second bonding comprises connecting a p-electrode 1p of the one light emitting element 1 and an n-electrode In of other one of the light emitting elements 1 with a wire 6. The third bonding comprising connecting a p-electrode 1p of the other light emitting element 1 and the second lead 12 (e.g., among two extending parts 12a, one extending part 12a where the protective element is not mounted), with a wire 6. By the foregoing first to third bonding, the two light emitting elements 1 are connected in series between the first lead 11 and the second lead 12.

In the step of wiring the light emitting element, the order of the first to third bonding is not particularly specified. For example, they may be performed in order of the first bonding, the second bonding, and the third bonding, or in order of the third bonding, the second bonding, and the first bonding. Alternatively, it is also possible to first perform the second bonding, and thereafter perform the first bonding and the third bonding, or the third bonding and the first bonding. Although the step of wiring the light emitting element does not specify the order of the bonding, the connecting to the n-electrode In and to the p-electrode 1p of each light emitting element 1 is preferably performed by the ball bonding. This can reduce a stress due to a load applied to the light emitting elements 1 in the bonding.

4-2. Wiring Protective Element

In the step of wiring the protective element, as shown in FIG. 6A, the cathode-side terminal electrode 3a formed at the upper surface of the protective element 3 mounted on the extending part 12a is connected to the first lead 11 with the wire 5. Here, for example, the first end 5a being one end of the wire 5 is connected to the first surface 11ms of the first lead 11, and thereafter the second end 5b being other end of the wire 5 is connected to the terminal electrode 3a of the protective element 3.

Specifically, the first end 5a, which is one end of the wire 5, is connected onto the first surface 11ms of the first lead 11 (e.g., the surface of the main part 11a) by the ball bonding (i.e., the first bonding). Subsequently, the second end 5b, which is the other end of the wire 5, is connected onto the terminal electrode 3a formed at the upper surface of the protective element 3 by the wedge bonding (i.e., the second bonding). The wedge bonding in the second bonding is more advantageous than the ball bonding in being capable of providing higher bonding strength. Despite the protective element 3 being disposed at a position close to the outer periphery of the light emitting device, high reliability on the connection is obtained. Further, in the light emitting device according to the present embodiment, the protective element 3 can be disposed close to the outer periphery of the light emitting device. Thus, the region on which the light emitting element 1 is mounted is reduced, and downsizing of the light emitting device can be achieved.

However, as described above, the wedge bonding cause a greater stress due to load compared with the ball bonding. Accordingly, in the manufacturing method of the present embodiment in which the wire 5 is connected onto the terminal electrode 3a by the wedge bonding, for example, the bump 4 is preferably formed on the terminal electrode 3a of the protective element 3, and the second end 5b of the wire 5 is connected onto the bump 4 by the wedge bonding, to thereby reduce the load applied to the protective element 3 by the wedge bonding,

5. Forming Resin Frame

Figure 7A:
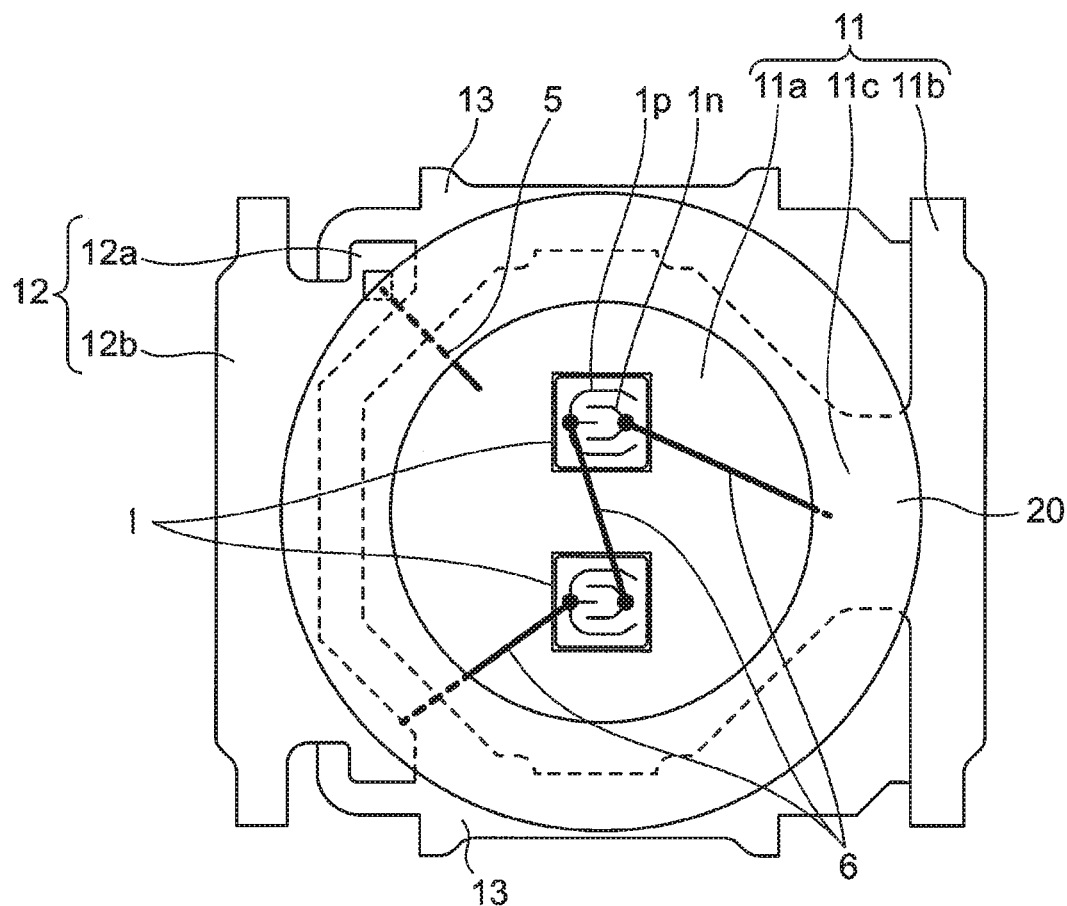
FIG. 7A is a plan view of a unit region after forming a resin frame 20 surrounding the mounted light emitting elements 1 and covering the protective element 3.
Figure 7B:
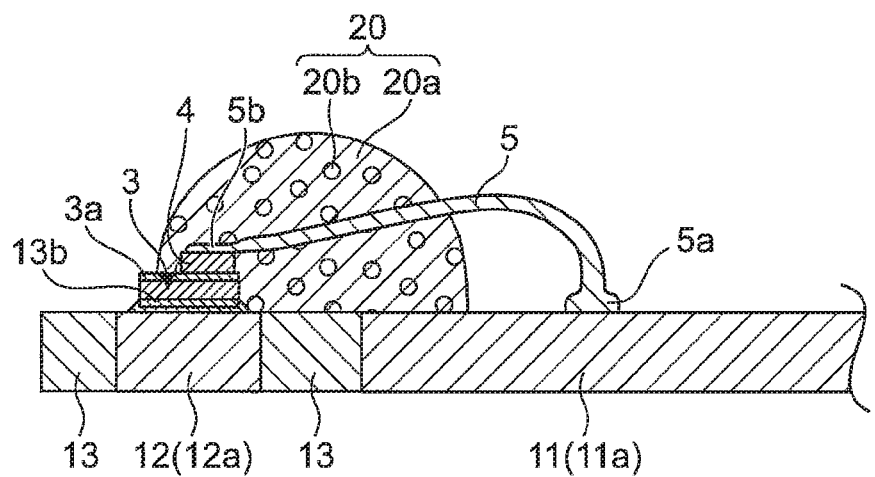
FIG. 7B is a cross-sectional view showing the same portion as FIG. 5B after forming the resin frame.

As shown in FIG. 7A, in the step of forming the resin frame, the resin frame 20 is annularly formed to surround at least the light emitting element 1 and the first end 5a of the wire 5. The resin frame 20 is formed to surround the light emitting element 1 and the first end 5a of the wire 5 while being spaced apart from the light emitting element 1 and the first end 5a of the wire 5. The resin frame 20 is formed by, for example, discharging liquid-state resin for forming the resin frame from a dispenser at a constant amount and, for example, to shift by a predetermined radius surrounding the center of the main part 11a so that the resin is annularly applied and dried. Here, the resin for forming the resin frame contains a resin material for structuring the resin portion 20a, and the light-reflective member 20b.

The resin frame 20 is preferably formed so as to embed at least part of the protective element 3, and more preferably the second end 5b of the wire 5, which is the connecting part to the terminal electrode 3a of the protective element 3. This structure can improve the connection strength at the connecting part between the terminal electrode 3a of the protective element 3 and the second end 5b of the wire 5. Further, the resin frame 20 is preferably formed to embed the connecting part between the wire 6 forming the wiring of the light emitting element 1 and the first lead 11, and the connecting part between the wire 6 and the second lead 12. This can improve the connection strength at the connecting part between the wire 6 and the first lead 11, and at the connecting part between the wire 6 and the second lead 12. Here, the resin frame 20 can be formed to have a desired annular shape by, for example, adjusting as appropriate the radius surrounding the center of the main part 11a around which the dispenser is shifted.

The width of the resin frame 20 (i.e., the distance between the inner periphery and the outer periphery of the resin frame 20 at the upper surface of the base member 10) and the cross-sectional shape of the resin frame such as height can be adjusted by setting the viscosity of the resin discharged from the dispenser, the amount of the resin discharged from the dispenser, and the shifting speed of the dispenser, as appropriate.

The resin material that forms the resin portion 20a of the resin frame 20 may be phenolic resin, epoxy resin, BT resin, PPA, or silicone resin. In particular, the material of the resin frame 20 is preferably silicone resin, which exhibits good light resistance, and more preferably, dimethyl-based silicone resin. Dimethyl-based silicone resin has a smaller refractive index compared with phenyl-based silicone resin, and is capable of increasing the difference in refractive index between the resin portion 20a and, for example, the light-reflective member 20b. In this manner, provision of the light-reflective member 20b having a greater difference in refractive index from the resin portion 20a can increase reflectivity to light from the light emitting element 1 of the resin frame 20, and consequently improves the light extraction efficiency of the light emitting device.

The light-reflective member may comprise, for example, titanium oxide, aluminum oxide, zirconium oxide, or magnesium oxide. In particular, titanium oxide is suitable due to its relatively high stability to moisture and the like, and exhibiting a high refractive index. The reflectivity of the resin frame 20 relative to light from the light emitting element 1 is preferably at least 60%, and more preferably at least 70%.

Figure 9:
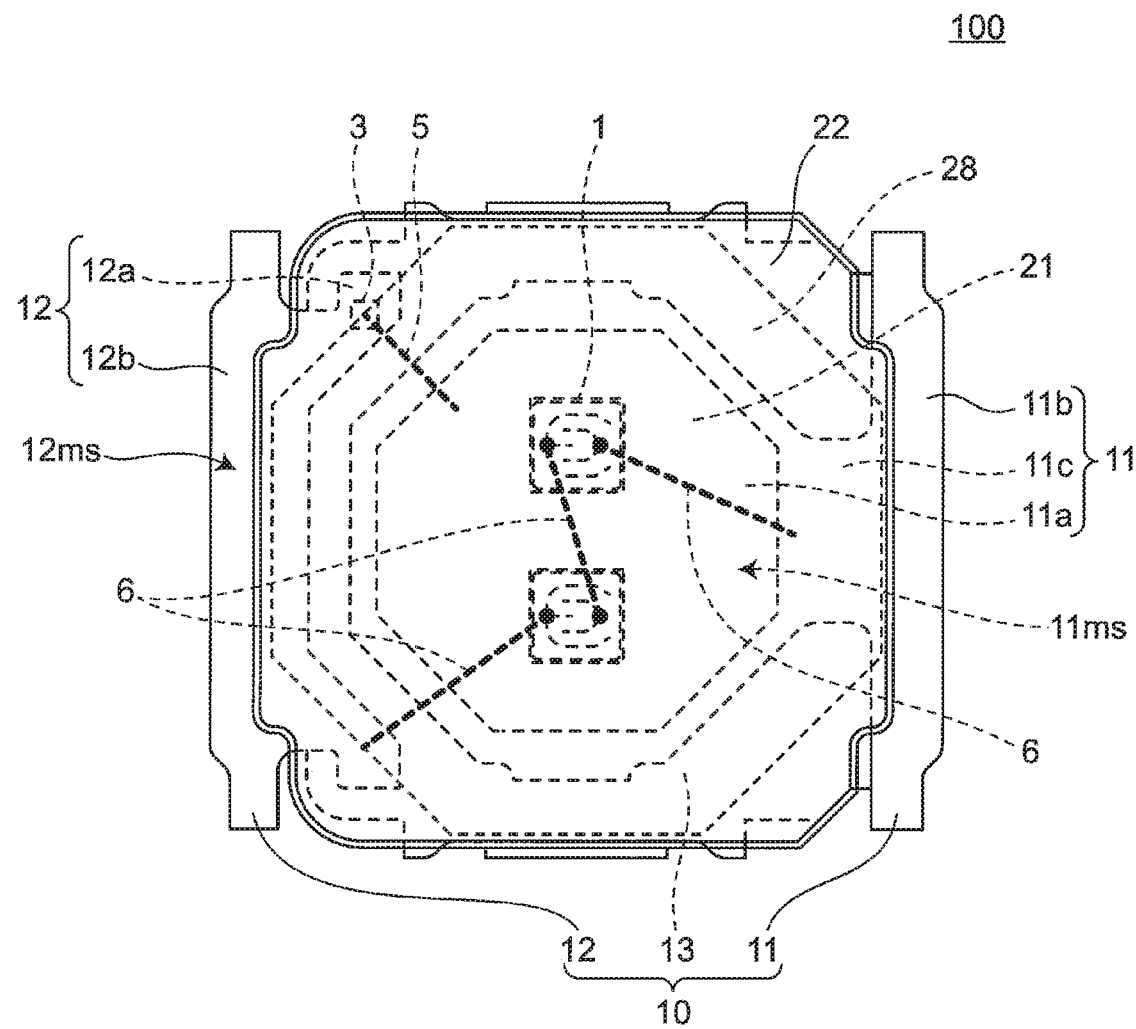
FIG. 9 is a plan view showing a variation of the light emitting device according to an embodiment of the present disclosure.

The shape of the resin frame as seen in a plan view may be circular as shown in FIG. 7A, or may be substantially octagonal as shown in FIG. 9. In FIG. 9, the resin frame is denoted by reference character 28. In the case where the main part 11a of the first lead 11 is substantially octagonal as seen in a plan view, the planar shape of the resin frame is preferably substantially octagonal. That is, preferably, as seen in a plan view, the main part 11a of the first lead 11 and the resin frame are substantially similar in shape. With this structure, the upper surface of the base member 10 positioned inward of the resin frame can be easily formed by only the upper surface of the first lead 11 and, consequently, improve the light extraction efficiency of the light emitting device. Further, preferably, at least one side of the outer edge of the main part 11a of the first lead 11 and at least one side of the outer edge of the resin frame are substantially parallel to each other. Further, preferably, at least two sides, more preferably at least three sides, and further preferably at least four sides, of the outer edge of the main part 11a of the first lead 11 and those of the outer edge of the resin frame are substantially parallel to each other. With this structure, the upper surface of the base member 10 positioned inward of the resin frame can be easily configured by only the upper surface of the first lead 11. In the present specification, a "substantially identical plane" includes a tolerance of about ±50 μm.

6. Forming First Resin Part

Figure 8A:
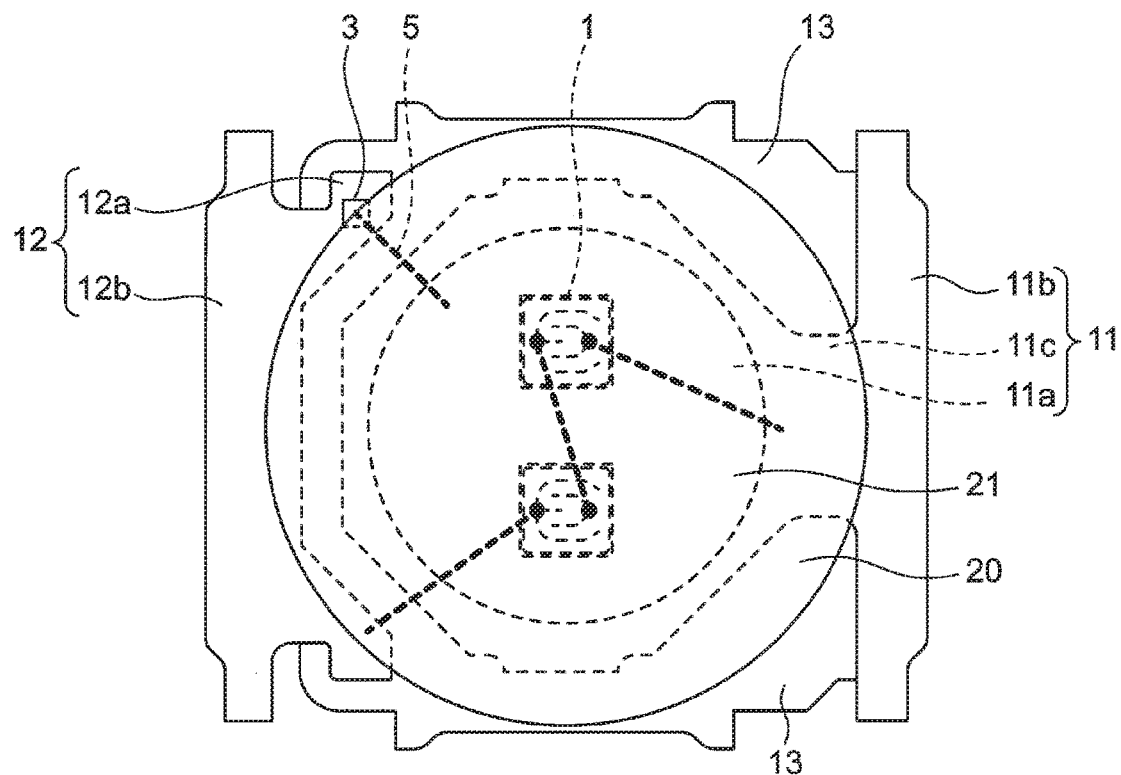
FIG. 8A is a plan view of a unit region after a first resin part is formed inward of the resin frame.
Figure 8B:
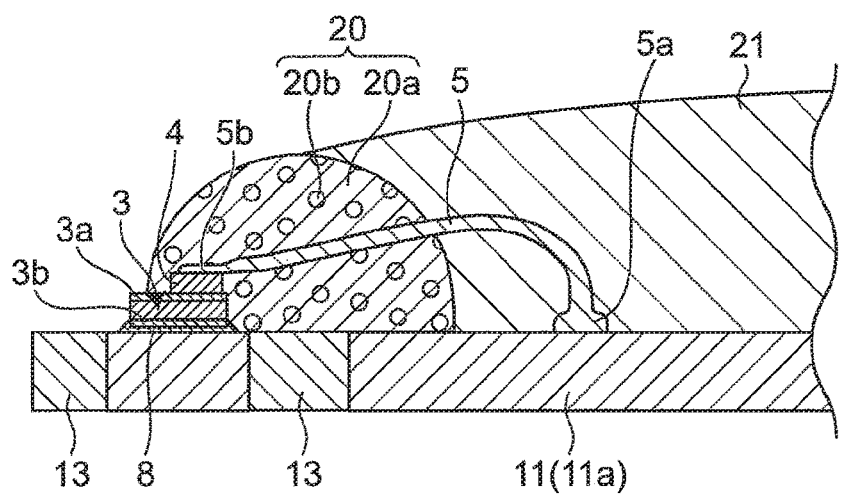
FIG. 8B is a cross-sectional view showing the same portion as FIG. 5B after forming the first resin part.

In the step of forming the first resin part, as shown in FIGS. 8A and 8B, the area defined by the resin frame 20 is filled with the first resin and the first resin is cured to form the first resin part 21. The first resin part 21 encapsulates the light emitting element 1 and the first end 5a of the wire 5, which are surrounded by the resin frame 20 while being embedded in the first resin part 21. The first resin part 21 is formed by, for example, discharging the first resin from a dispenser starting from the central part of the main part 11a so that the space defined by the resin frame 20 is filled with the first resin, and curing the resin. Here, the first resin part 21 can be formed to have a shape corresponding to the viscosity of the first resin discharged from the dispenser and the discharge amount from the dispenser, for example, by adjusting the viscosity of the first resin discharged from the dispenser and the discharge amount from the dispenser. FIG. 8B shows an example where, the outer periphery edge of the first resin part 21 substantially coincides with the ridge at the apex of the resin frame 20 by adjusting the viscosity and discharge amount of the first resin, and the thickness of first resin 21 from the base member 10 becomes greater from the outer periphery edge toward the central part of the first resin part 21.

The resin material of the first resin part 21 may be polycarbonate resin, epoxy resin, phenolic resin, silicone resin, acrylic resin, polymethylpentene resin, polynorbornene resin, modified resin of the foregoing resins, or hybrid resin containing at least one of the foregoing resins. In particular, the resin material of the first resin part 21 is preferably silicone resin which exhibits good light resistance, more preferably, phenyl-based silicone resin which exhibits a high refractive index. Phenyl-based silicone resin has higher hardness compared with dimethyl-based silicone resin, and is capable of protecting the light emitting element 1 and the first end 5a of the wire 5 from an external force. The first resin part 21 may contain a wavelength conversion member. The wavelength conversion member is a member that converts wavelength of light having a first peak wavelength emitted from the light emitting element into light having a second peak wavelength which is different from the first peak wavelength. The first resin part 21 containing the wavelength conversion member can attain output of mixed-color light being the mixture of the light having the first peak wavelength emitted from the light emitting element and the light having the second peak wavelength emitted from the wavelength conversion member. For example, when a blue-color LED is employed as the light emitting element and a fluorescent material such as YAG is employed as the wavelength conversion member, a light emitting device that outputs white-color light is obtained, which white-color light is the mixture of blue-color light of the blue-color LED and yellow-color light that the fluorescent material emits by being excited by the blue-color light.

7. Forming Second Resin Part

As shown in FIGS. 1A and 1B, in the step of forming the second resin part, the second resin part 22 is formed so as to cover the resin frame 20 and the first resin part 21.

For example, as shown in FIGS. 1A and 1B, the second resin part 22 is formed so that:

(a) the terminal part 11b of the first lead 11 is exposed along one side of the light emitting device outside the second resin part 22, and the terminal part 12b of the second lead 12 is exposed along other side opposite to the one side; and (b) when the protective element 3 is exposed outside the resin frame 20, the second resin part 22 covers at least the exposed protective element 3, preferably, substantially an entirety of the extending part 12a of the second lead 12.

Further, the second resin part 22 is formed by, for example, transfer molding. Specifically, an upper mold having a hollow corresponding to the shape of the second resin part 22 (e.g., a lens shape) is disposed on the base member 10 so that the hollow covers the resin frame 20 and the first resin part 21, and a lower mold is disposed on the base member 10 while being in contact with the lower surface of the resin frame 20. Then, resin for forming the second resin part 22 is injected into the hollow, and the resin is cured.

As described above, the second resin part 22 is formed.

The second resin part 22 is may comprise, for example, polycarbonate resin, epoxy resin, phenolic resin, silicone resin, acrylic resin, polymethylpentene resin, polynorbornene resin, modified resin of the foregoing resins, or hybrid resin including at least one of the foregoing resins. In particular, preferably the resin material of the second resin part 22 is silicone resin, and more preferably the resin material is dimethyl-based silicone resin which is highly light transmissive and less likely to discolor due to light.

Through the foregoing steps, the light emitting device according to an embodiment is manufactured.

What is claimed is:
1. A light emitting device comprising:
   a base member comprising:
      a first lead,
      a second lead, and
      a supporting member holding the first lead and the second lead while electrically separating the first lead and the second lead from each other,
      wherein the base member has an upper surface including a first surface, which is a surface of the first lead, a second surface, which is a surface of the second lead, and a third surface, which is a surface of the supporting member;
   a light emitting element located on the first surface;
   a protective element located on the second surface and including a terminal electrode;
   a wire having a first end connected to the first surface, and a second end connected to the terminal electrode of the protective element;
   a resin frame located on the upper surface of the base member so as to cover at least part of the protective element, wherein, in a plan view, the resin frames surrounds the light emitting element, and the resin frame surrounds the first end of the wire while being spaced from the first end of the wire;
   a first resin part surrounded by the resin frame and covering the light emitting element and the first end of the wire; and
   a second resin part covering the resin frame and the first resin part, wherein:
   the resin frame comprises a resin portion and a light-reflective member,
   a refractive index of the first resin part is greater than a refractive index of the second resin part and greater than a refractive index of the resin portion of the resin frame,
   a refractive index of the light-reflective member of the resin frame is greater than a refractive index of the resin portion of the resin frame, and
   a portion of the protective element is positioned outward of the resin frame and is covered with the second resin part.

2. The light emitting device according to claim 1, wherein the first end of the wire has a ball shape having a diameter greater than a diameter of the wire.

3. The light emitting device according to one of claim 1, wherein the second end of the wire has a shape thinner than a diameter of the wire, and is connected to the terminal electrode via a bump provided at the terminal electrode.

4. The light emitting device according to claim 1, wherein the second end of the wire is embedded in the resin frame.

5. The light emitting device according to claim 1, wherein the first surface of the first lead, the second surface of the second lead, and the third surface of the supporting member are coplanar with one another.

6. The light emitting device according to claim 5, wherein the first lead includes a lateral surface between an upper surface and a lower surface, and the lateral surface includes a projecting part.

7. The light emitting device according to claim 1, wherein the resin portion of the resin frame contains dimethyl silicone resin, the first resin part contains phenyl silicone resin, and the second resin part contains dimethyl silicone resin.

8. The light emitting device according to claim 1, wherein the upper surface of the base member positioned inward of the resin frame is formed by the upper surface of the first lead.

9. The light emitting device according to claim 1, wherein a resin from which the first resin part is comprised is harder than a resin from which the second resin part is comprised.

10. The light emitting device according to claim 1, wherein a refractive index of the light-reflective member of the resin frame is greater than a refractive index of the first resin part.

11. The light emitting device according to claim 1, wherein a difference between a refractive index of the light-reflective member of the resin frame and a refractive index of the resin portion of the resin frame is 1 or greater.

12. The light emitting device according to claim 1, further comprising an additional wire having a first end connected to the light emitting element, and a second end connected to the second lead, wherein a connecting part between the additional wire and the second lead is embedded in the resin frame.

13. The light emitting device according to claim 1, wherein a bump is formed on the terminal electrode of the protective element and the second end of the wire is connected to the bump by wedge bonding.

14. The light emitting device according to claim 1, wherein a shape of the resin frame is octagonal, the first lead includes a main part that is octagonal in a plan view.

* * * * *